United States Patent
Shishiguchi et al.

(10) Patent No.: US 6,190,976 B1
(45) Date of Patent: Feb. 20, 2001

(54) FABRICATION METHOD OF SEMICONDUCTOR DEVICE USING SELECTIVE EPITAXIAL GROWTH

(75) Inventors: Seiichi Shishiguchi; Tomoko Yasunaga, both of Tokyo (JP)

(73) Assignee: NEC Corporation (JP)

( * ) Notice: Under 35 U.S.C. 154(b), the term of this patent shall be extended for 0 days.

(21) Appl. No.: 09/198,763

(22) Filed: Nov. 24, 1998

(30) Foreign Application Priority Data

Nov. 26, 1997 (JP) .................................................. 9-325037

(51) Int. Cl.$^7$ .................................................. H01L 21/336
(52) U.S. Cl. .......................... 438/299; 438/300; 438/301; 438/302
(58) Field of Search .................................. 438/300, 301, 438/302, 299

(56) References Cited

U.S. PATENT DOCUMENTS

| | | |
|---|---|---|
| 5,079,180 * | 1/1992 | Rodder et al. . |
| 5,168,072 * | 12/1992 | Mollehi . |
| 5,200,352 * | 4/1993 | Pfiester . |
| 5,250,454 * | 10/1993 | Maszara . |
| 5,496,750 * | 3/1996 | Moslehi . |
| 5,504,031 * | 4/1996 | Hsu et al. . |
| 5,677,214 * | 10/1997 | Hsu . |
| 5,691,212 * | 11/1997 | Tsai et al. . |
| 5,710,450 * | 1/1998 | Chau et al. . |
| 5,733,792 * | 3/1998 | Masuoka . |
| 5,759,899 * | 6/1998 | Saito . |
| 5,760,451 * | 6/1998 | Yu . |
| 5,824,586 * | 10/1998 | Wollesen et al. . |
| 5,879,997 * | 3/1999 | Lee et al. . |
| 5,946,578 * | 8/1999 | Fujii . |
| 5,953,605 * | 9/1999 | Kodama . |
| 5,967,794 * | 10/1999 | Kodama . |

FOREIGN PATENT DOCUMENTS 63-166271 7/1988 (JP) ................................ H01L/29/78

* cited by examiner

*Primary Examiner*—Jey Tsai
*Assistant Examiner*—Jonathan Hack
(74) *Attorney, Agent, or Firm*—Hayes, Soloway, Hennessey, Grossman & Hage, P.C.

(57) ABSTRACT

A fabrication method of a semiconductor device with an IGFET is provided, which makes it possible to decrease the current leakage due to electrical short-circuit between a gate electrode and source/drain regions of the IGFET through conductive grains deposited on its dielectric sidewalls. After the basic structure of the IGFET is formed, first and second single-crystal Si epitaxial layers are respectively formed on the first and second source/drain regions by a selective epitaxial growth process. Then, the surface areas of the first and second single-crystal Si epitaxial layers are oxidized, and the oxidized surface areas of the first and second single-crystal Si epitaxial layers are removed by etching. If unwanted grains of poly-Si or amorphous Si are grown on the first and second dielectric sidewalls in the selective epitaxial growth process, the unwanted grains are oxidized and removed, thereby preventing electrical short-circuit from occurring between the gate electrode and the first and second source/drain regions through the unwanted grains deposited on the first and second dielectric sidewalls.

5 Claims, 8 Drawing Sheets

FABRICATION METHOD OF SEMICONDUCTOR DEVICE USING SELECTIVE EPITAXIAL GROWTH

BACKGROUND OF THE INVENTION

1. Field of the Invention

The present invention relates to a fabrication method of a semiconductor device and more particularly, to a fabrication method of a semiconductor device with an Insulated-Gate Field-Effect Transistor (IGFET) using selective epitaxial growth of silicon (Si).

2. Description of the Prior Art

In recent years, semiconductor devices have been becoming miniaturized more and more according to the increase in their integration scale. Under such the circumstances, a lot of electronic devices such as memory or logic devices have been integrated on a semiconductor substrate or chip. In these highly-integrated semiconductor devices, IGFETs such as Metal-Oxide-Semiconductor Field-Effect Transistors (MOSFETs) are typically used.

To cope with the progressing miniaturization and increasing integration tendency, there has been the need to solve the problems induced by the short-channel effects in IGFETs. A known solution to solve the problems is to decrease the depth of source/drain regions of the IGFETs. However, the depth decrease of the source/drain regions causes another problem that the sheet resistance of the source/drain regions is increased and simultaneously, the contact resistance of the source/drain regions with wiring materials is also increased.

To solve this problem, there has been developed several methods that epitaxial layers are respectively formed on the source/drain regions by the use of the selective epitaxial growth technique. An example of the conventional methods of this sort is shown in FIGS. 1A to 1C.

It is needless to say that a lot of IGFETs are formed on a semiconductor substrate. However, only one of the IGFETs is explained here for the sake of simplification.

Figure 1A:
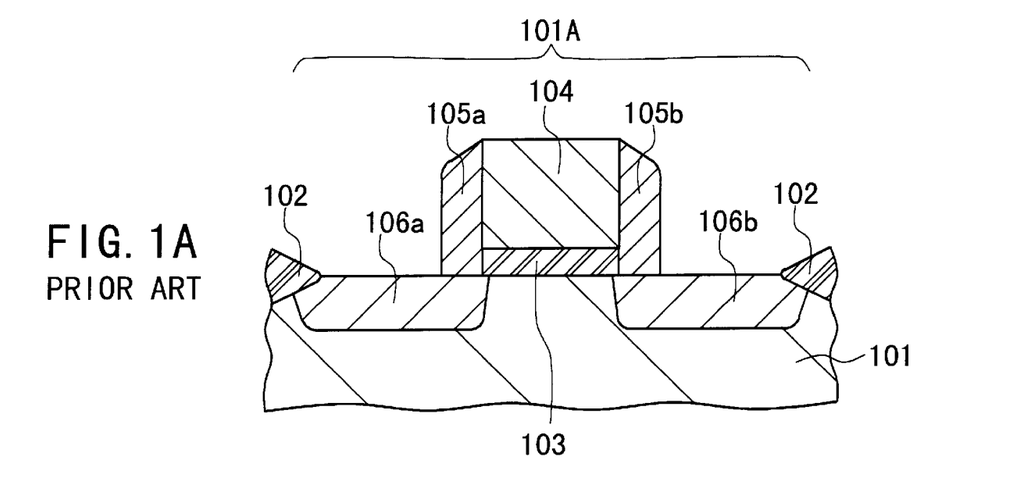
FIGS. 1A to 1C are schematic, partial cross-sectional views showing the process steps of a conventional fabrication method of a semiconductor device with IGFETs, respectively.
Figure 1B:
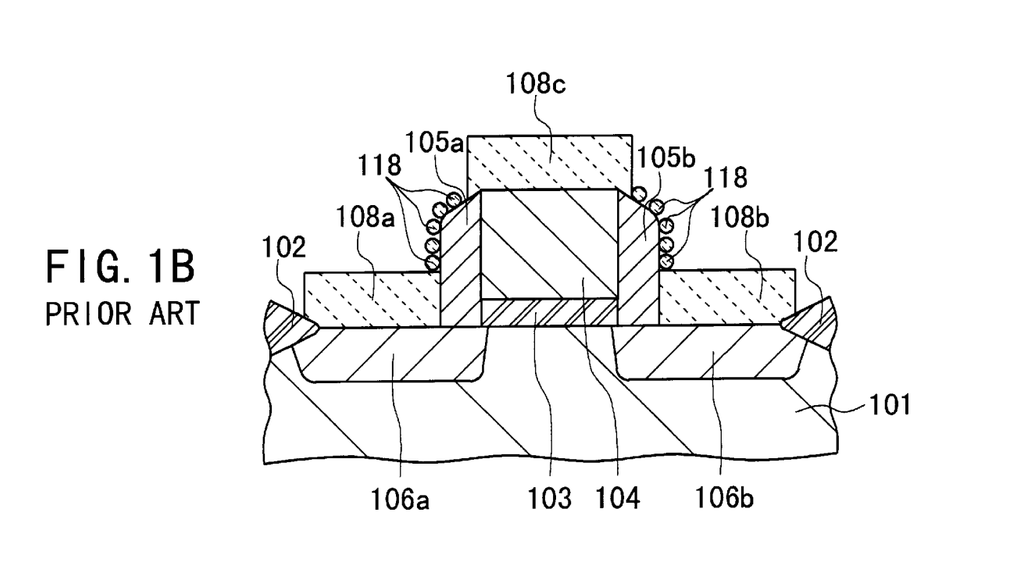
Figure 1C:
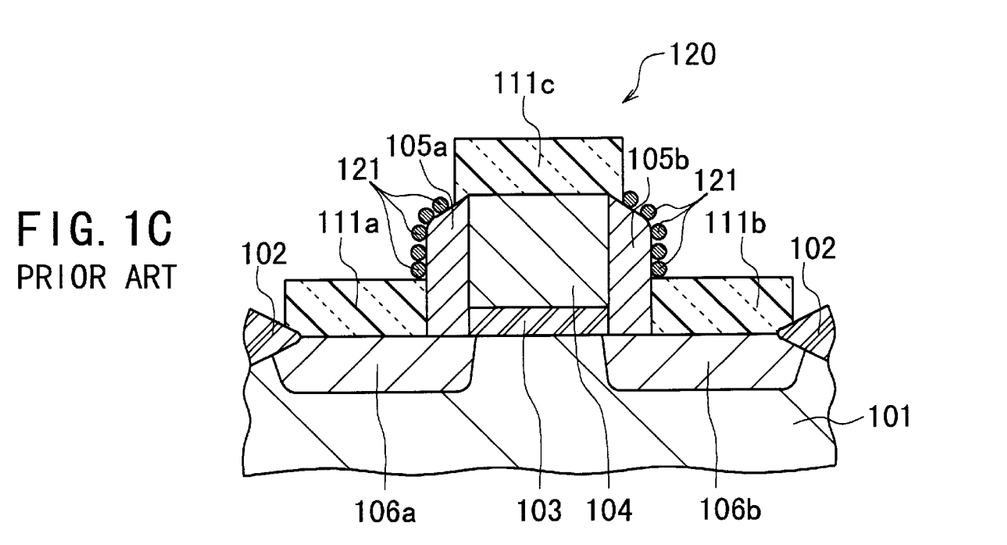

First, a basic transistor configuration is formed through the popular processes, as shown in FIG. 1A.

Specifically, an isolation dielectric 102 is selectively formed on a main surface of a single-crystal Si substrate 101, thereby defining an active region 101A where an IGFET 120 is formed. A gate oxide 103 is formed on the surface of the substrate 101 in the active region 101A. A polycrystalline Si (poly-Si) gate electrode 104 is formed on the gate oxide 103. Source/drain regions 106a and 106b are formed in the surface area of the substrate 101 at each side of the gate electrode 104 in the active region 101A. Dielectric sidewalls 105a and 105b are respectively formed on the source/drain regions 106a and 106b at each side of the gate electrode 104. The sidewalls 105a and 105b are in contact with the corresponding side faces of the gate electrode 104.

Next, by the use of the selective epitaxial growth technique, single-crystal Si epitaxial layers 108a and 108b are respectively formed on the uncovered source/drain regions 106a and 106b and at the same time, a poly-Si layer 108c is formed on the uncovered gate electrode 104, as shown in FIG. 1B. This epitaxial growth process of Si is carried out in self-alignment to the isolation dielectric 102 and the sidewall oxides 105.

Subsequently, a refractory metal such as titanium (Ti) is deposited to cover the whole surface of the substrate 101, thereby forming a refractory metal layer (not shown) in contact with the single-crystal Si epitaxial layers 108a and 108b and the poly-Si layer 108c. Then, the substrate 101 equipped with the refractory metal layer is annealed by heat treatment to cause a silicidation reaction between the refractory metal layer and the single-crystal Si epitaxial layers 108a and 108b and the poly-Si layer 108c.

Thus, refractory silicide layers 111a and 111b are formed on the source/drain regions 106a and 106b, respectively. At the same time as this, a refractory silicide layer 111c is formed on the gate electrode 104. The state at this stage is shown in FIG. 1C.

Through the above-described processes, the IGFET 120 is constituted by the gate oxide 103, the gate electrode 104, the source/drain regions 106a and 106b, the dielectric sidewalls 105a and 105b, the single-crystal Si epitaxial layers 111a and 111b, and the poly-Si layer 111c, as shown in FIG. 1C.

The single-crystal Si epitaxial layers 111a and 111b have the same functions as those of the source/drain regions 106a and 106b, respectively. The poly-Si layer 111c has the same function as that of the gate electrode 104.

With the conventional fabrication method of a semiconductor device shown in FIGS. 1A to 1C, the above-identified problem that the sheet resistance of the source/drain regions 106a and 106b is increased and the contact resistance of the source/drain regions 106a and 106b with wiring materials is increased is able to be solved while the source/drain regions 106a and 106b are formed shallow.

However, in the selective epitaxial growth process of Si shown in FIG. 1B, there is a possibility that poly-Si or amorphous Si is deposited on the surfaces of the dielectric sidewalls 105a and 105b and the isolation dielectric 102. This is caused by lowering of the degree of selectivity due to deviation in epitaxial growth condition.

In FIG. 1B, the reference symbol 118 denotes grains of poly-Si or amorphous Si deposited on the surfaces of the dielectric sidewalls 105a and 105b. In FIG. 1C, the reference symbol 121 denotes the grains of refractory silicide produced due to the silicidation reaction of the poly-Si or amorphous Si grains 118.

The conductive refractory silicide grains 121 cause a problem that electrical short-circuit tends to occur between the gate electrode 104 and any one of the source/drain regions 106a and 106b. This electrical short-circuit leads to leakage currents of the IGFET 120.

As the single-crystal Si epitaxial layers 108a and 108b, and the poly-Si layer 108c become thicker, the substantial distances between the gate electrode 104 and the single-crystal Si epitaxial layers 108a and 108b formed on the source/drain regions 106a and 106b become shorter. In this case, therefore, the electrical short-circuit tends to occur even if the refractory silicide grains 121 have a smaller size.

Additionally, the Japanese Non-Examined Patent Publication No. 63-166271 published in 1988 discloses another fabrication method of a semiconductor device with an IGFET.

In this method, prior to a wet etching process for selectively removing a silicon dioxide ($SiO_2$) layer formed on a main surface of a single-crystal Si substrate to result in a gate oxide, silicon nitride ($Si_3N_4$) layers are deposited on the surfaces of dielectric sidewalls made of $SiO_2$. Because $Si_3N_4$ has a lower etch rate than $SiO_2$ against a popular etchant such as hydrogen fluoride (HF), the dielectric sidewalls are prevented from being etched during this wet etching process.

Accordingly, the electrical short-circuit between a gate electrode and source/drain regions due to etching of the dielectric sidewalls at their bottoms during the above wet etching process is prevented from occurring.

As clearly seen, the conventional fabrication method disclosed in the Japanese Non-Examined Patent Publication No. 63-166271 is unable to solve the previously-explained problem of electrical short-circuit due to the grains 121 of refractory silicide.

SUMMARY OF THE INVENTION

Accordingly, an object of the present invention to provide a fabrication method of a semiconductor device with an IGFET that makes it possible to decrease the current leakage due to electrical short-circuit between a gate electrode and source/drain regions of the IGFET through conductive grains deposited on its dielectric sidewalls.

Another object of the present invention is to provide a fabrication method of a semiconductor device with an IGFET that improves the fabrication yield and reliability of the semiconductor device.

The above objects together with others not specifically mentioned will become clear to those skilled in the art from the following description.

A fabrication method of a semiconductor device according to the present invention it comprised of the following steps (a) to (h):

In the step (a), an isolation dielectric is formed on a main surface of a single-crystal Si substrate of a first conductivity type, thereby defining an active region.

In the step (b), a basic transistor structure is formed in the active region. The basic transistor structure includes a gate insulator formed on the main surface of the substrate, a gate electrode formed on the gate insulator, first and second source/drain regions of a second conductivity type opposite to the first conductivity type formed in the substrate at each side of the gate electrode, and first and second dielectric sidewalls formed at each side of the gate electrode in contact with corresponding surfaces of the first and second source/drain regions and corresponding side faces of the gate electrode.

In the step (c), single-crystal Si is selectively grown on uncovered surfaces of the first and second source/drain regions, thereby forming first and second single-crystal Si epitaxial layers on the first and second source/drain regions, respectively.

In the step (d), surface areas of the first and second single-crystal Si epitaxial layers are oxidized.

In the step (e), the oxidized surface areas of the first and second single-crystal Si epitaxial layers are removed by etching.

In the step (f), a refractory metal layer is formed in contacted with the first and single-crystal Si epitaxial layers whose oxidized surface areas have been removed.

In the step (g), the refractory metal layer is reacted with the first and second single-crystal Si epitaxial layers by heat treatment, thereby forming first and second refractory silicide layers on the first and second source/drain regions, respectively. The first and second refractory silicide layers have same functions as those of the first and second source/drain regions, respectively.

In the step (h), the unreacted refractory metal layer is removed, thereby constituting an IGFET with the basic transistor structure and the first and second refractory silicide layers.

With the fabrication method of a semiconductor device according to the present invention, after the basic transistor structure is formed in the step (b), the first and second single-crystal Si epitaxial layers are respectively formed on the first and second source/drain regions by a selective epitaxial growth process in the step (c). Then, the surface areas of the first and second single-crystal Si epitaxial layers are oxidized in the step (d) and the oxidized surface areas of the first and second single-crystal Si epitaxial layers are removed by etching in the step (e).

Therefore, if unwanted grains of poly-Si or amorphous Si are grown on the first and second dielectric sidewalls in the step (c) of growing the first and second single-crystal Si epitaxial layers, the unwanted grains are oxidized in the step (d) and then, removed in the step (e). Accordingly, electrical short-circuit is prevented from occurring between the gate electrode and the first and second source/drain regions through the unwanted grains deposited on the first and second dielectric sidewalls.

Also, because electrical short-circuit is prevented from occurring between the gate electrode and the first and second source/drain regions through the unwanted grains of poly-Si or amorphous Si, the fabrication yield and reliability of the semiconductor device with the IGFET are improved.

In a preferred embodiment of the method according to the present invention, the gate electrode is made of poly-Si in the step (b). A poly-Si layer is selectively grown on the gate electrode in the step (c).

In this embodiment, the total thickness of the gate electrode and the poly-Si layer is increased simultaneously with the increase of the total thickness of the first source/drain region and the first refractory silicide layer and that of the second source/drain region and the second refractory silicide layer. Therefore, there is an additional advantage that the possibility of the electrical short-circuit between the gate electrode and the first and second source/drain regions is lowered.

In another preferred embodiment of the method according to the present invention, a step of reforming etched parts of the first and second dielectric sidewalls is additionally provided between the steps (e) and (f). In this embodiment, no disadvantage is caused by the etched parts of the first and second dielectric sidewalls in the step (e).

The step of reforming the etched parts of the first and second dielectric sidewalls may be the same as or different from the step of forming the first and second dielectric sidewalls.

In still another preferred embodiment of the method according to the present invention, the first and second dielectric sidewalls are made of silicon nitride.

In this embodiment, since the first and second dielectric sidewalls are made of silicon nitride, the first and second dielectric sidewalls are not removed by etching in the step (e) of removing the oxidized surface areas of the first and second single-crystal Si epitaxial layers. Therefore, there is no possibility that nay disadvantage is caused by the etched parts of the first and second dielectric sidewalls. Also, there is an additional advantage that the above-described step of reforming the etched parts of the first and second dielectric sidewalls is unnecessary.

Any refractory metal may be used for the refractory metal layer. However, any one of titanium (Ti), tungsten (W), Molybdenum (Mo), and cobalt (Co) is preferably used. This is because each of these refractory metals will produce a proper silicide material fore realizing the same function as that of the first and second source/drain regions.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

FIRST EMBODIMENT

FIGS. 2A to 2F show a fabrication method of a semiconductor device according to a first embodiment of the present invention.

It is needless to say that the semiconductor device has a lot of IGFETs formed on a semiconductor substrate. However, only one of the IGFETs is explained here for the sake of simplification.

Figure 2A:
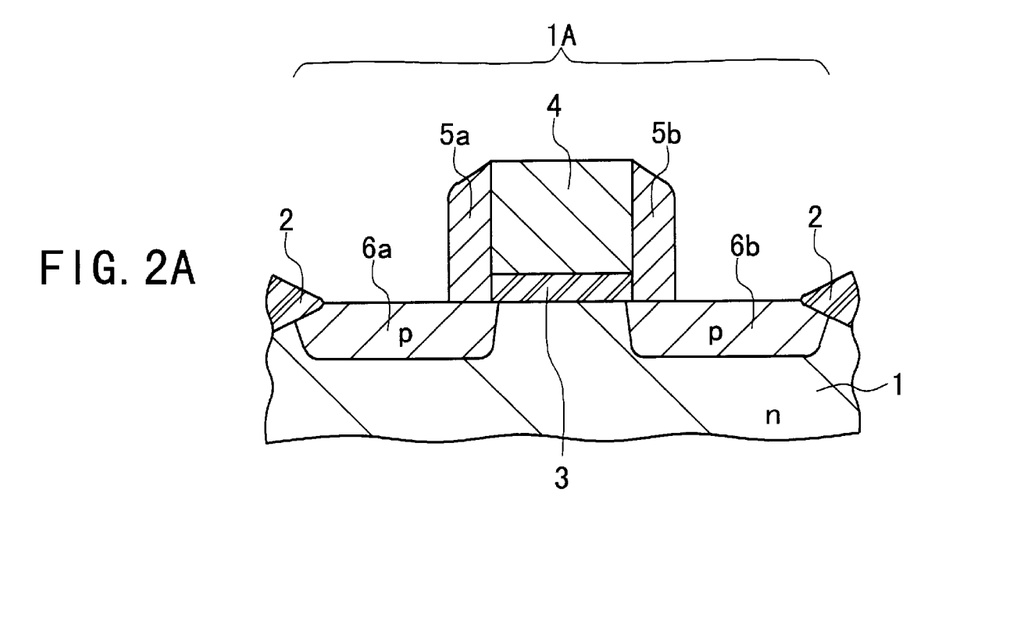
FIGS. 2A to 2F are schematic, partial cross-sectional views showing the process steps of a fabrication method of a semiconductor device with IGFETs according to a first embodiment of the present invention, respectively.

In this method, first, as shown in FIG. 2A, an isolation dielectric 2 made of $SiO_2$ is selectively formed on the surface region of an n-type single-crystal Si substrate 1 by a LOCal Oxidation of Silicon (LOCOS) process, thereby defining an active region 1A in which an IGFET 20 is formed.

A $SiO_2$ layer (not shown) with a thickness of 8 nm is formed on the whole exposed surface of the substrate 1 in the active region 1A by a thermal oxidation process. Then, a poly-Si layer (not shown) with a thickness of 200 nm is deposited on the $SiO_2$ layer over the whole substrate 1 by a Chemical Vapor Deposition (CVD) process.

The poly-Si layer and the underlying $SiO_2$ layer are patterned to a specific plan shape by the use of popular photolithography and etching techniques, thereby forming a gate oxide 3 from the $SiO_2$ layer and a gate electrode 4 from the poly-Si layer in the active region 1A, as shown in FIG. 2A. The gate electrode 4 is located on the gate oxide 3. Since the $SiO_2$ layer is selectively etched, the remaining surface of the substrate 1 in the active region 1A is exposed from the $SiO_2$ layer through this patterning process. The gate oxide 3 is formed by the remaining $SiO_2$ layer.

A $SiO_2$ layer (not shown) with a thickness of 80 nm is deposited over the whole substrate 1 to cover the gate electrode 4, the gate oxide 3, and the isolation dielectric 2 by a CVD process. Then, the $SiO_2$ layer thus deposited is etched back by an anisotropic etching process, thereby forming dielectric sidewalls 5a and 5b on the exposed surface of the substrate 1 at each side of the gate electrode 4. The dielectric sidewalls 5a and 5b, which are made of $SiO_2$, are contacted with the corresponding side faces of the gate electrode 4 and the exposed surface of the substrate 1.

Subsequently, as a p-type dopant, boron fluoride ($BF_2$) ions are selectively implanted into the active region 1A of the substrate 1 by an ion-implantation process at an acceleration energy of 30 keV with a dose of $1 \times 10^{15}$ atoms/cm$^2$. The substrate 1 is then subjected to an annealing process at a temperature of 1000° C., thereby activating the implanted boron (B) atoms. Thus, p-type source/drain regions 6a and 6b are formed in the active region 1A at each side of the gate electrode 4. The source/drain regions 6a and 6b thus formed are in self alignment to the gate electrode 4, the dielectric sidewalls 5a and 5b, and the isolation dielectric 2.

Since the $BF_2$ ions are implanted into the poly-Si gate electrode 4 also in the ion-implantation process, the gate electrode 4 is turned to have a p-type conductivity, resulting in decrease in its electric resistance.

Through the above-described processes, the basic transistor structure is fabricated, as shown in FIG. 2A.

Following this step of forming the source/drain regions 6a and 6b, Si is selectively and epitaxially grown on the uncovered surfaces of the source/drain regions 6a and 6b by a selective epitaxial growth process. In this process, poly-Si is selectively grown on the uncovered surface of the gate electrode 4. The growth condition of this selective epitaxial growth process is as follows.

An Ultra-High-Vacuum (UHV) CVD apparatus, the minimum vacuum pressure of which is $1 \times 10^{-10}$ Torr and the evacuation rate of a growth chamber (not shown) of which is 500 liter/sec [nitrogen ($N_2$)-equivalent value], is used.

Before the Si substrate 1 with the basic transistor structure is introduced into the growth chamber of the UHV CVD apparatus, this substrate 1 is subjected to a cleaning process using a diluted HF solution, a rinsing solution using pure water, and a drying process.

Next, the Si substrate 1 with the basic transistor structure is introduced into the growth chamber and then, it is annealed in a vacuum atmosphere with a pressure of $1 \times 10^{-10}$ Torr at a temperature of 800° C., thereby removing native oxide produced on the uncovered surface of the substrate 1.

Figure 2B:
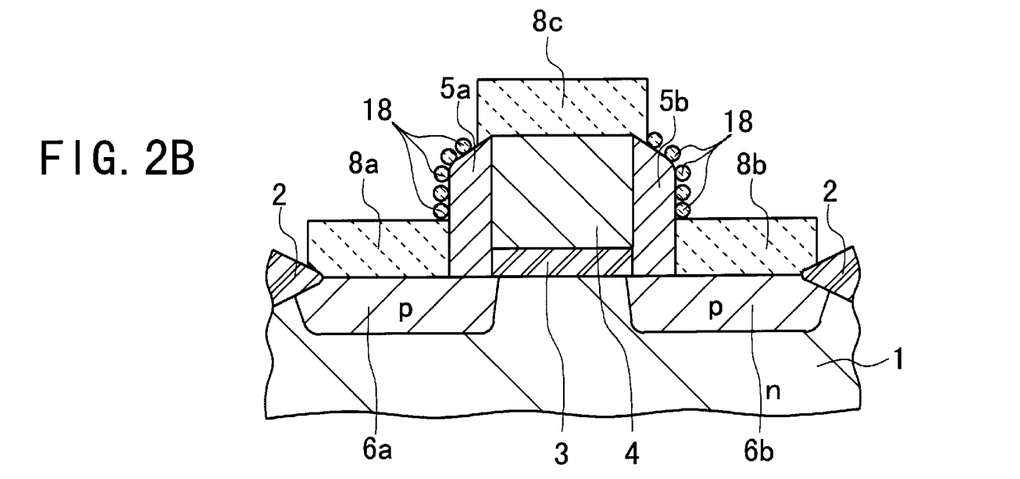

Following this annealing process, the temperature of the substrate 1 is held at a temperature of 650° C. and a gas of $Si_2H_4$ is supplied to the growth chamber as a Si source at a flow rate of 5 sccm. Thus, single-crystal Si epitaxial layers 8a and 8b with a thickness of 80 nm are grown on the uncovered surfaces of the source/drain regions 6a and 6b, respectively, as shown in FIG. 2B. At the same time as this, a poly-Si layer 8c with a thickness of 80 nm is grown on the uncovered surface of the gate electrode 4.

Here, it is supposed that unwanted grains 18 of poly-Si or amorphous Si are deposited on the uncovered surfaces of the dielectric sidewalls 5a and 5b, as shown in FIG. 2B. The conductive grains 18 thus deposited may interconnect electrically the single-crystal Si epitaxial layers 8a and 8b with the poly-Si layer 8c.

Figure 2C:
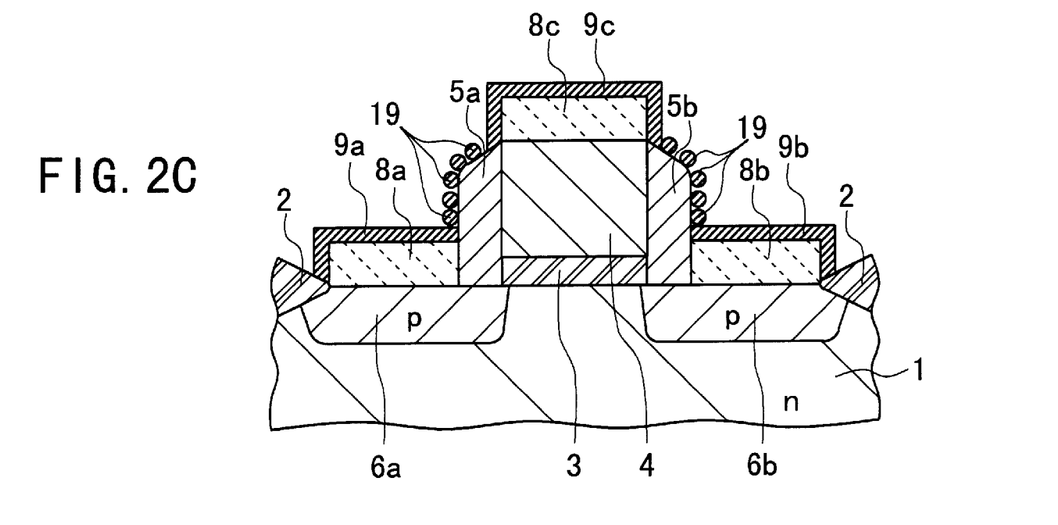

Subsequently, the single-crystal Si epitaxial layers 8a and 8b and the poly-Si layer 8c are thermally oxidized in an oxygen ($O_2$) atmosphere at a temperature of 1000° C. for approximately 10 minutes. Thus, as shown in FIG. 2C, a $SiO_2$ layer 9a is formed in the surface region of the single-crystal Si epitaxial layer 8a, a $SiO_2$ layer 9b is formed in the surface region of the single-crystal Si epitaxial layer 8b, and a $SiO_2$ layer 9c is formed in the surface region of the poly-Si layer 8c. The $SiO_2$ layers 9a, 9b, and 9c have a same thickness of 20 nm.

Through this thermal oxidation process, the unwanted grains 18 of poly-Si or amorphous Si are oxidized, resulting in $SiO_2$ grains 19 deposited on the uncovered surfaces of the dielectric sidewalls 5a and 5b, as shown in FIG. 2C.

Figure 2D:
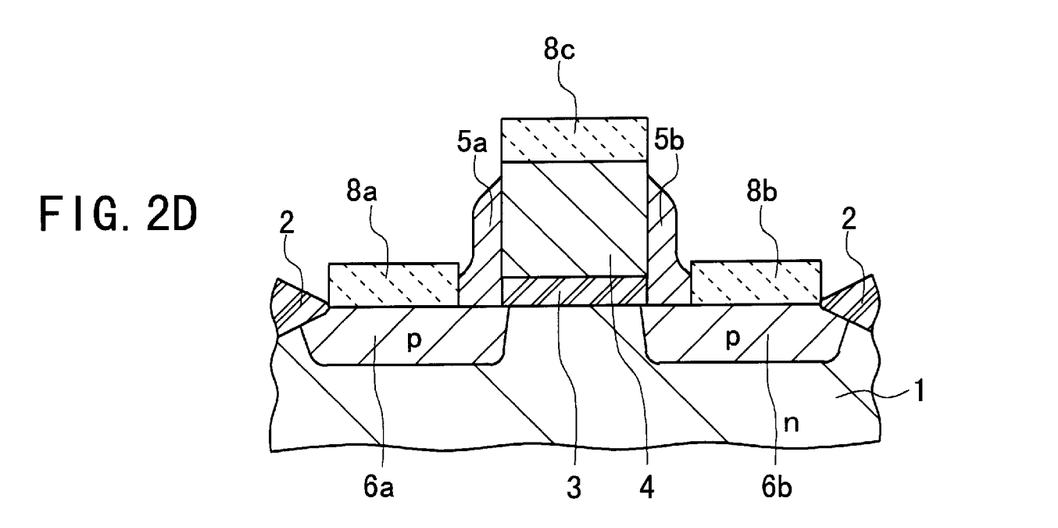

Further, to selectively remove the $SiO_2$ layers 9a, 9b, and 9c thus formed, the substrate 1 with the $SiO_2$ layers 9a, 9b, and 9c is subjected to a wet etching process using a diluted HF solution. In this etching process, the dielectric sidewalls 5a and 5b made of $SiO_2$ are partially etched. The state of this stage is shown in FIG. 2D. The thickness of the $SiO_2$ layers 9a, 9b, and 9c is decreased to approximately 60 nm to this etching process.

Through this wet etching process, the unwanted $SiO_2$ grains 19 deposited on the uncovered surfaces of the dielectric sidewalls 5a and 5b are removed entirely, as shown in FIG. 2D.

Figure 2E:
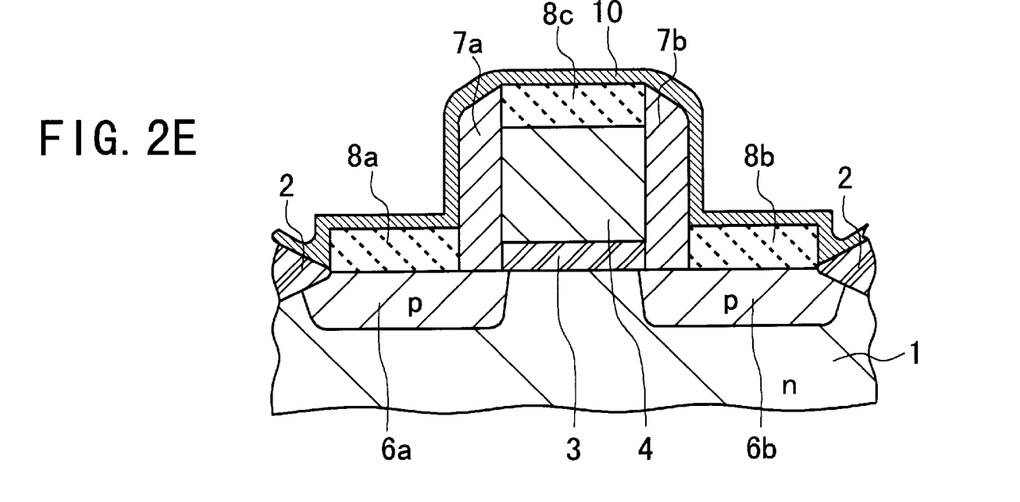

Next, a $SiO_2$ layer (not shown) is deposited to cover the whole surface of the substrate 1 by a CVD process. The $SiO_2$ layer thus deposited is etched back by an isotropic etching process, thereby forming dielectric sidewalls 7a and 7b made of $SiO_2$, as shown in FIG. 2E. This means that the dielectric sidewalls 5a and 5b made of $SiO_2$ are reformed by the dielectric sidewalls 7a and 7b, respectively.

A titanium (Ti) layer 10 is deposited to cover the whole surface of the substrate 1 by a sputtering process. The Ti layer 10 is in contact with the single-crystal Si epitaxial layers 8a and 8b and the poly-Si layer 8c. The state at this stage is shown in FIG. 2E.

Figure 2F:
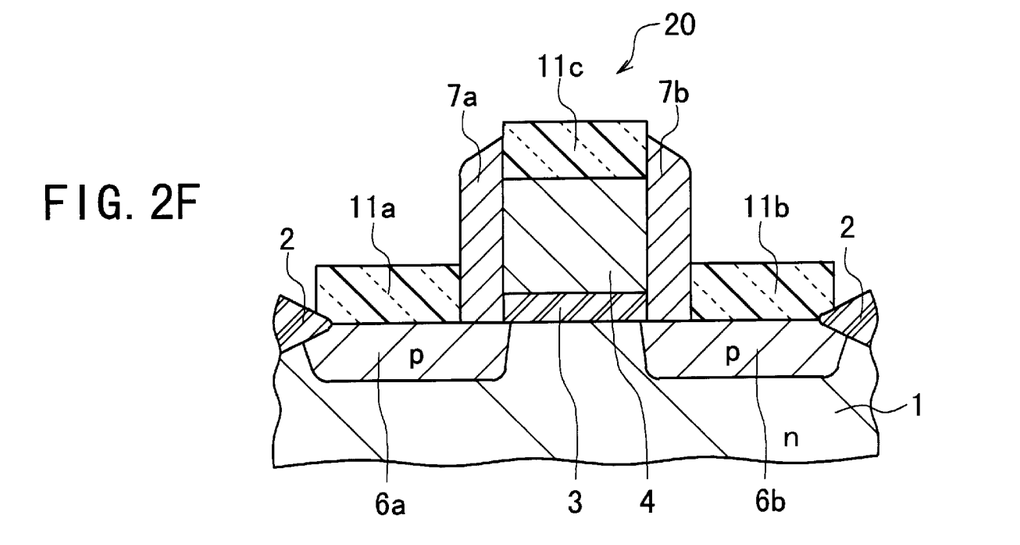

The Ti layer 10 thus deposited is then subjected to a heat treatment process at a specific temperature using a lamp annealing apparatus, thereby reacting the Ti layer 20 with the contacted single-crystal Si epitaxial layers 8a and 8b and the contacted poly-Si layer 8c. Thus, due to a silicidation reaction, titanium silicide layers 11a, 11b, and 11c are formed on the source/drain regions 6a and 6b and the gate electrode 4, respectively, as shown in FIG. 2F.

This silicidation process is carried out in self-alignment to the single-crystal Si epitaxial layers 8a and 8b and the contacted poly-Si layer 8c. This means that this process is a typical one of the so-called "Self-Aligned SILICIDE (SALICIDE)" processes.

Thereafter, the unreacted Ti layer 10 is removed by an etching process. Thus, the IGFET 20 is fabricated as shown in FIG. 2F. The IGFET 20 is formed by the gate oxide 3, the gate electrode 4, the source/drain regions 6a and 6b, the dielectric sidewalls 7a and 7b, the single-crystal Si epitaxial layers 11a and 11b, and the poly-Si layer 11c. The single-crystal Si epitaxial layers 11a and 11b have the same functions as those of the source/drain regions 6a and 6b, respectively. The poly-Si layer 11c has the same function as that of the gate electrode 4.

Finally, an interlayer dielectric layer is formed to cover the IGFET thus fabricated and then, a wiring layer or layers are formed on the interlayer dielectric layer to be electrically connected to the source/drain regions 6a and 6b and the gate electrode 4 by the use of known processes. Thus, the semiconductor device is completed.

As explained above, with the fabrication method of a semiconductor device according to the first embodiment, after the basic transistor structure shown in FIG. 2A is formed, the single-crystal Si epitaxial layers 8a and 8b and the poly-Si layer 8c are respectively formed on the source/drain regions 6a and 6b and the gate electrode 4 by the selective epitaxial growth process, as shown in FIG. 2B. Next, the surface areas of the single-crystal Si epitaxial layers 8a and 8b and the poly-Si layer 8c are thermally oxidized to form $SiO_2$ layers 9a, 9b, and 9c and then, the $SiO_2$ layers 9a, 9b and 9c are removed by the wet etching process, as shown in FIGS. 2C and 2D.

Therefore, even if the unwanted grains 18 of poly-Si or amorphous Si are grown on the dielectric sidewalls 5a and 5b in the selective epitaxial growth process of growing the single-crystal Si epitaxial layers 8a and 8b and the poly-Si layer 8c, the unwanted grains 18 are oxidized in the thermal oxidation process to result in the $SiO_2$ grains 19 as shown in FIG. 2C, and the $SiO_2$ grains 19 are removed in the subsequent wet etching process together with the $SiO_2$ layers 9a, 9b, and 9c in the layers 8a, 8b, and 8c.

Accordingly, electrical short-circuit is prevented from occurring between the gate electrode 4 and the source/drain regions 6a and 6b through the unwanted grains 18 of poly-Si or amorphous Si deposited on the dielectric sidewalls 5a and 5b.

Also, because electrical short-circuit is prevented from occurring between the gate electrode 4 and the source/drain regions 6a and 6b through the unwanted grains 18 of poly-Si or amorphous Si, the fabrication yield and reliability of the semiconductor device with the IGFET are improved.

SECOND EMBODIMENT

FIGS. 3A to 3F show a fabrication method of a semiconductor device according to a second embodiment of the present invention.

The method according to the second embodiment includes the same process steps as those in the method according to the first embodiment except that dielectric sidewalls 12a and 12b made of silicon nitride ($Si_3N_4$) are used instead of the dielectric sidewalls 5a and 5b (or, 7a and 7b) made of $SiO_2$.

Therefore, explanation about the same process steps as those in the first embodiment is omitted here by attaching the same reference numerals to the same elements in FIGS. 8A to 8C for the sake of simplification.

Figure 3A:
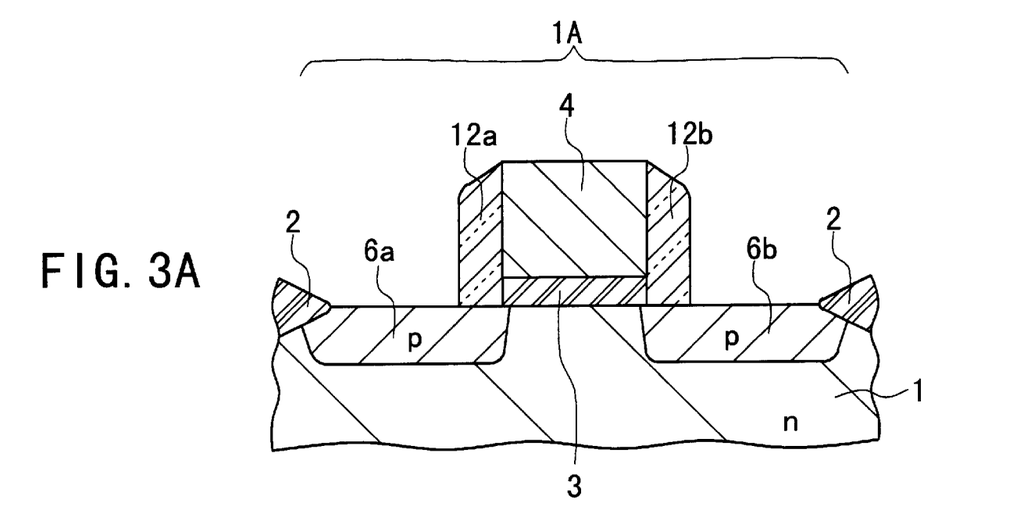
FIGS. 3A to 3F are schematic, partial cross-sectional views showing the process steps of a fabrication method of a semiconductor device with IGFETs according to a second embodiment of the present invention, respectively.

First, as shown in FIG. 3A, an isolation dielectric 2 made of $SiO_2$ is selectively formed on the surface region of an n-type single-crystal Si substrate 1, thereby defining an active region 1A in which an IGFET 30 is formed. A $SiO_2$ layer (not shown) with a thickness of 8 nm is formed on the whole exposed surface of the substrate 1 in the active region 1A. A poly-Si layer (not shown) with a thickness of 200 nm is deposited on the $SiO_2$ layer over the whole substrate 1. The poly-Si layer and the underlying $SiO_2$ layer are patterned to a specific plan shape, thereby forming a gate oxide 3 from the $SiO_2$ layer and a gate electrode 4 from the poly-Si layer in the active region 1A, as shown in FIG. 3A.

The above processes are the same as those in the first embodiment.

Next, a $Si_3N_4$ layer (not shown) with a thickness of 80 nm is deposited over the whole substrate 1 to cover the gate electrode 4, the gate oxide 3, and the isolation dielectric 2 by a CVD process. Then, the $Si_3N_4$ layer thus deposited is etched back by an anisotropic etching process, thereby forming dielectric sidewalls 12a and 12b on the exposed surface of the substrate 1 at each side of the gate electrode 4. The dielectric sidewalls 12a and 12b, which are made of $Si_3N_4$, are contacted with the corresponding side faces of the gate electrode 4 and the exposed surface of the substrate 1.

Subsequently, through the same ion-plantation process of boron fluoride (BF) and the same annealing process as those in the first embodiment, p-type source/drain regions 6a and 6b are formed in the active region 1A at each side of the gate electrode 4. The source/drain regions 6a and 6b thus formed are in self alignment to the gate electrode 4, the dielectric sidewalls 12a and 12b, and the isolation dielectric 2. The gate electrode 4 is turned to have a p-type conductivity through the processes, resulting in decrease in its electric resistance.

Through the above-described processes, the basic transistor structure is fabricated, as shown in FIG. 3A.

Figure 3B:
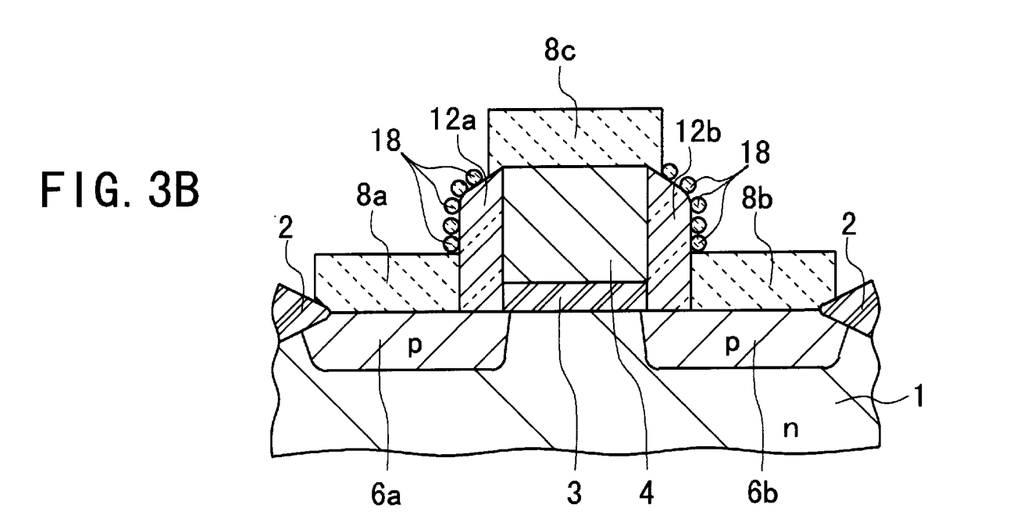

Following this step of forming the source/drain regions 6a and 6b, Si is selectively and epitaxially grown on the uncovered surfaces of the source/drain regions 6a and 6b by a selective epitaxial growth process under the same growth condition as that of the first embodiment. In this process, poly-Si is selectively grown on the uncovered surface of the gate electrode 4. Thus, single-crystal Si epitaxial layers 8a and 8b with a thickness of 80 nm are grown on the uncovered surfaces of the source/drain regions 6a and 6b, respectively, as shown in FIG. 4B. At the same time as this, a poly-Si layer 8c with a thickness of 80 nm is grown on the uncovered surface of the gate electrode 4.

Here, it is supposed that unwanted grains 18 of poly-Si or amorphous Si are deposited on the uncovered surfaces of the dielectric sidewalls 12a and 12b, as shown in FIG. 3B. The conductive grains 18 thus deposited may interconnect electrically the single-crystal Si epitaxial layers 8a and 8b with the poly-Si epitaxial layer 8c.

Figure 3C:
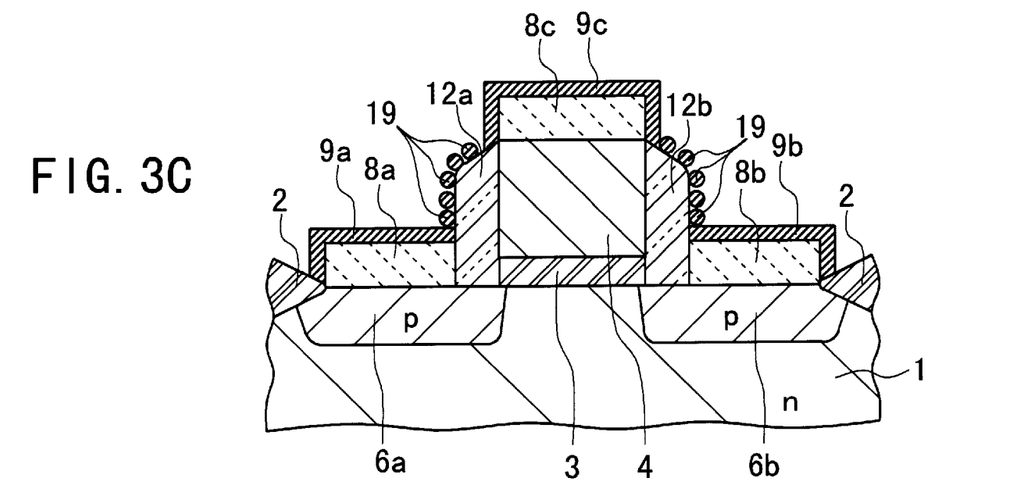

Subsequently, the single-crystal Si epitaxial layers 8a and 8b and the poly-Si layer 8c are oxidized by a thermal oxidation process under the same condition as used in the first embodiment. Thus, as shown in FIG. 3C, a $SiO_2$ layer 9a is formed in the surface region of the single-crystal Si epitaxial layer 8a, a $SiO_2$ layer 9b is formed in the surface region of the single-crystal Si epitaxial layer 8b, and a $SiO_2$ layer 9c is formed in the surface region of the poly-Si layer 8c. The $SiO_2$ layers 9a, 9b, and 9c have a same thickness of 20 nm.

Through this thermal oxidation process, the unwanted grains 18 of poly-Si or amorphous Si are oxidized, resulting in $SiO_2$ grains 19 deposited on the uncovered surfaces of the dielectric sidewalls 12a and 12b, as shown in FIG. 3C.

Figure 3D:
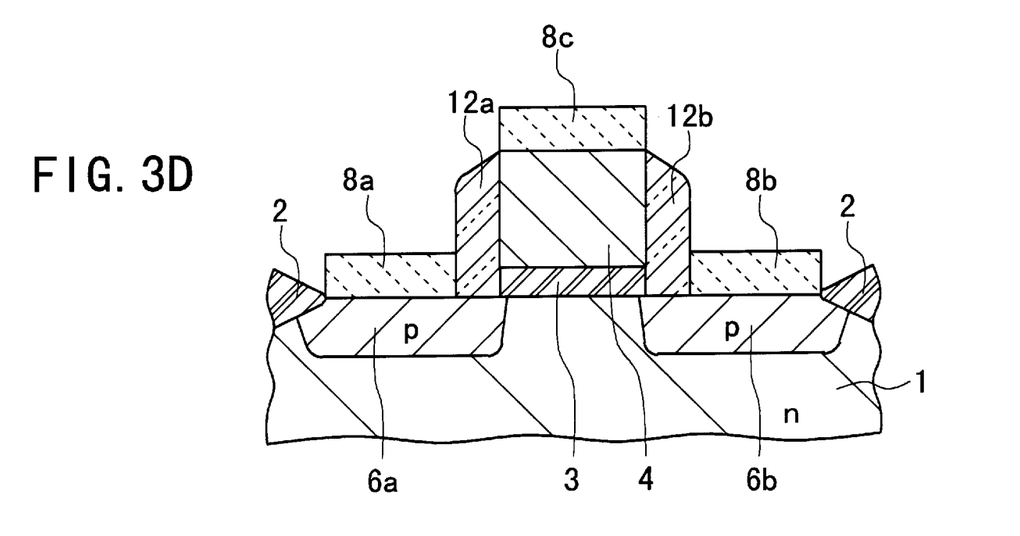

Further, to selectively remove the $SiO_2$ layers 9a, 9b, and 9c thus formed, the substrate 1 with the $SiO_2$ layers 9a, 9b, and 9c is subjected to a wet etching process using a diluted HF solution. Unlike the first embodiment, the dielectric sidewalls 12a and 12b are made of $Si_3N_4$. Therefore, they are not etched in this etching process. The state at this stage is shown in FIG. 3D. The thickness of the $SiO_2$ layers 9a, 9b, and 9c is decreased to approximately 60 nm due to this etching process, which is the same as that of the first embodiment.

Through this wet etching process, the unwanted $SiO_2$ grains 19 deposited on the uncovered surfaces of the dielectric sidewalls 5a and 5b are removed entirely, as shown in FIG. 3D.

Because the dielectric sidewalls 12a and 12b made of $Si_3N_4$ are not etched in the etching process, no reforming process of the sidewalls 12a and 12b is required. This leads to decrease in the number of necessary processes. However, there is a disadvantage that the degree of selectivity in the above-described epitaxial growth process between Si and $Si_3N_4$ is lower than that between Si and $SiO_2$ as used in the first embodiment. As a result, there may arise a problem that a desired degree of selectivity is not realized in the case where the thickness of the single-crystal Si epitaxial layers 8a and 8b and the poly-Si layer 8c is comparatively large.

Figure 3E:
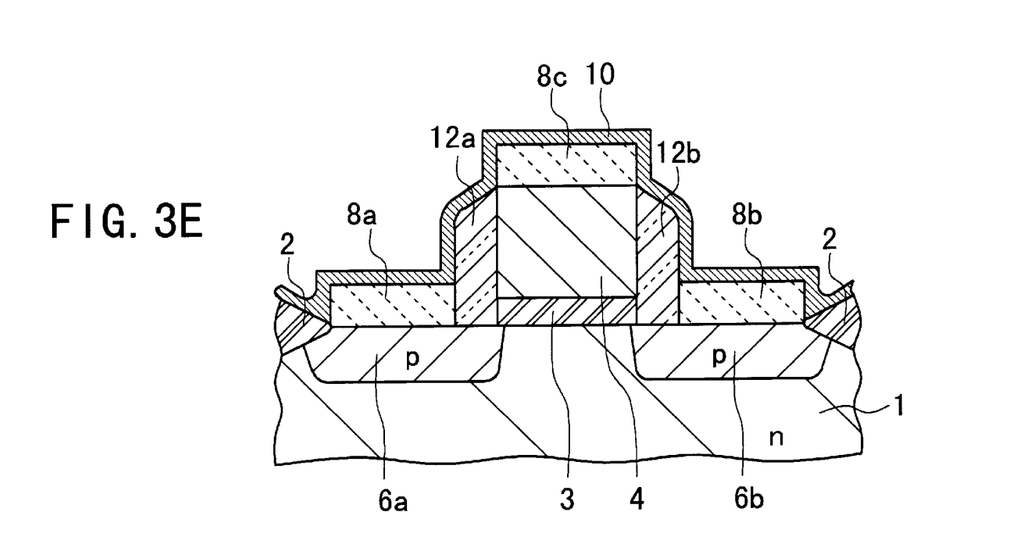
Figure 3F:
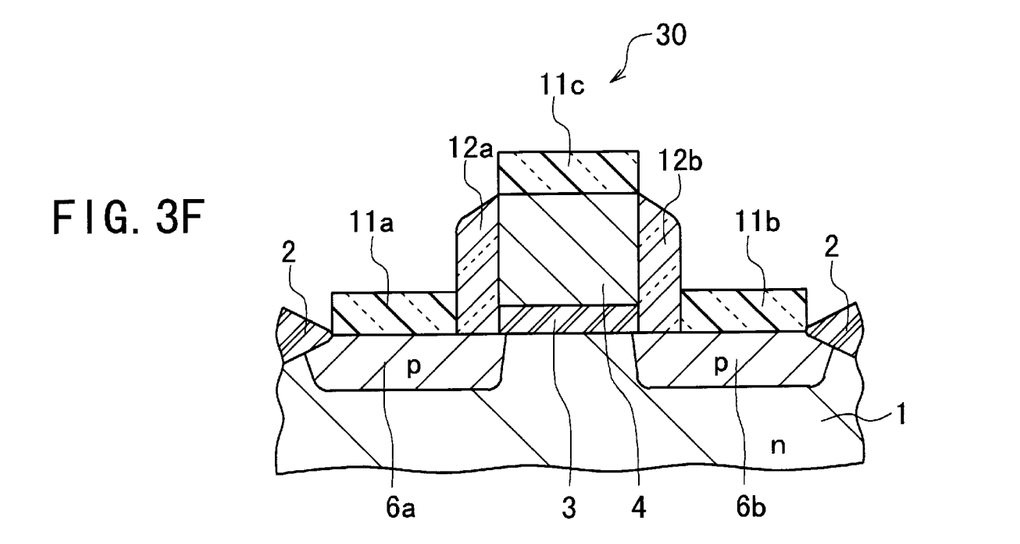

Subsequently, a titanium (Ti) layer 10 is deposited to cover the whole surface of the substrate 1 in such a way that the Ti layer 10 is in contact with the single-crystal Si epitaxial layers 8a and 8b and the poly-Si layer 8c. The state at this stage is shown in FIG. 3E. The Ti layer 10 thus deposited is then subjected to a heat treatment process, thereby reacting the Ti layer 10 with the contacted single-crystal Si epitaxial layers 8a and 8b and the contacted poly-Si layer 8c. Thus, due to a silicidation reaction, titanium silicide layers 11a, 11b, and 11c are formed on the source/drain regions 6a and 6b and the gate electrode 4, respectively, as shown in FIG. 3F. Thereafter, the unreacted Ti layer 10 is removed by an etching process. These processes are the same as those in the first embodiment.

Thus, the IGFET 30 is fabricated as shown in FIG. 3F. The IGFET 30 is formed by the gate oxide 3, the gate electrode 4, the source/drain regions 6a and 6b, the dielectric sidewalls 12a and 12b, the single-crystal Si epitaxial layers 11a and 11b, and the poly-Si layer 11c.

Finally, an interlayer dielectric layer is formed to cover the IGFET thus fabricated and then, a wiring layer or layers are formed on the interlayer dielectric layer to be electrically connected to the source/drain regions 6a and 6b and the gate electrode 4 by the use of known processes. Thus, the semiconductor device is completed. These processes are the same as those in the first embodiment.

As explained above, with the fabrication method of a semiconductor device according to the second embodiment, it is obvious that there are the same advantages as those in the first embodiment.

Although explanation are made of a p-channel IGFET in the first and second embodiments, the present invention is not limited thereto. It is needless to say that the present invention may be applied to an n-channel IGFET and Complementary MOSFETs.

Although Ti is used as the refractory metal in the first and second embodiments, the present invention is not limited to Ti. Any other refractory metal such as tungsten (W), cobalt (Co), and molybdenum (Mo) may be used in the present invention.

A UHV CVD apparatus is used for the selective epitaxial growth process in the first and second embodiments. However, a Low-Pressure CVD (LPCVD) apparatus may be used in the present invention.

While the preferred examples of the present invention have been described, it is to be understood that modifications will be apparent to those skilled in the art without departing from the spirit of the invention. The scope of the invention, therefore, it to be determined solely by the following claims.

What is claimed is:

1. A fabrication method of a semiconductor device, comprising the steps of:
    (a) forming an isolation dielectric on a main surface of a single-crystal Si substrate of a first conductivity type, thereby defining an active region;
    (b) forming a basic transistor structure in said active region;
    said basic transistor structure including a gate insulator formed on said main surface of said substrate, a gate electrode formed on said gate insulator, first and second source/drain regions of a second conductivity type opposite to said first conductivity type formed in said substrate at each side of said gate electrode, and first and second dielectric sidewalls formed at each side of said gate electrode in contact with corresponding surfaces of said first and second source/drain regions and corresponding side faces of said gate electrode;
    (c) selectively growing single-crystal Si on uncovered surfaces of said first and second source/drain regions, thereby forming first and second single-crystal Si epitaxial layers on said first and second source/drain regions, respectively;
    (d) oxidizing surface areas of said first and second single-crystal Si epitaxial layers;
    (e) removing said oxidized surface areas of said first and second single-crystal Si epitaxial layers by etching;

(f) forming a refractory metal layer in contacted with said first and second single-crystal Si epitaxial layers whose oxidized surface areas have been removed;

(g) reacting said refractory metal layer with said first and second single-crystal Si epitaxial layers by heat treatment, thereby forming first and second refractory silicide layers on said first and second source/drain regions, respectively;

said first and second refractory silicide layers having same functions as those of said first and second source/drain regions, respectively; and (h) removing said unreacted refractory metal layer, thereby constituting an IGFET with said basic transistor structure and said first and second refractory silicide layers.

2. The method as claimed in claim 1, wherein said gate electrode is made of poly-Si in the step (b);

and wherein a poly-Si layer is selectively grown on said gate electrode in the step (c).

3. The method as claimed in claim 1, further comprising a step of reforming etched parts of said first and second dielectric sidewalls between the steps (e) and (f).

4. The method as claimed in claim 1, wherein said first and second dielectric sidewalls are made of silicon nitride.

5. The method as claimed in claim 1, wherein said refractory metal layer is made of a refractory metal selected from the group consisting of titanium, tungsten, Molybdenum, and cobalt.

* * * * *